United States Patent [19]

Main

[11] 4,122,402
[45] Oct. 24, 1978

[54] BUFFER AMPLIFIER CIRCUIT SUITABLE FOR MANUFACTURE IN MONOLITHIC INTEGRATED CIRCUIT FORM

[75] Inventor: William Eric Main, Mesa, Ariz.

[73] Assignee: Motorola, Inc., Schaumburg, Ill.

[21] Appl. No.: 812,935

[22] Filed: Jul. 5, 1977

[51] Int. Cl.$^2$ .............................................. H03F 3/04
[52] U.S. Cl. ............................... 330/288; 307/299 B; 330/257; 330/296
[58] Field of Search ................... 307/299 B; 330/257, 330/288, 260, 291, 296

[56] References Cited

U.S. PATENT DOCUMENTS

| 3,783,400 | 1/1974 | Gay | 307/299 B X |
| 3,914,622 | 10/1975 | Fezzolo | 307/299 B X |

*Primary Examiner*—Lawrence J. Dahl

*Attorney, Agent, or Firm*—Maurice J. Jones, Jr.

[57] ABSTRACT

A buffer amplifier suitable for being driven by a differential amplifier having a differential-to-single ended converter is disclosed. The buffer amplifier includes a multi-collector input transistor of a first conductivity type and an emitter-follower output transistor of a second conductivity type. The base of the output transistor is connected to a first collector of the input transistor. A bias circuit for the output transistor is connected to the first collector of the input transistor and to the base of the output transistor. A negative feedback network is connected between the emitter of the output transistor and the base and second collector of the input transistor to stabilize the quiescent output voltage. Current sources are utilized for maximizing the amplitude of the dynamic output voltage and for facilitating temperature independence.

16 Claims, 4 Drawing Figures

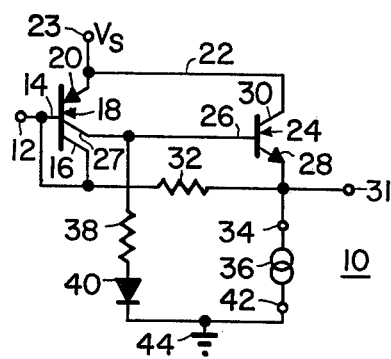
FIG. 1
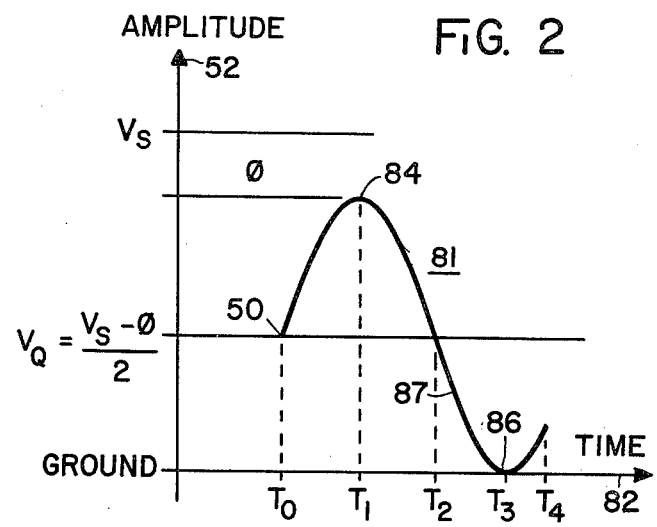
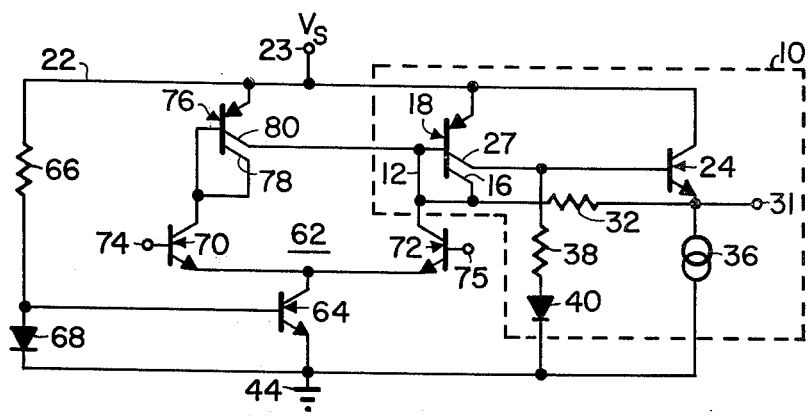
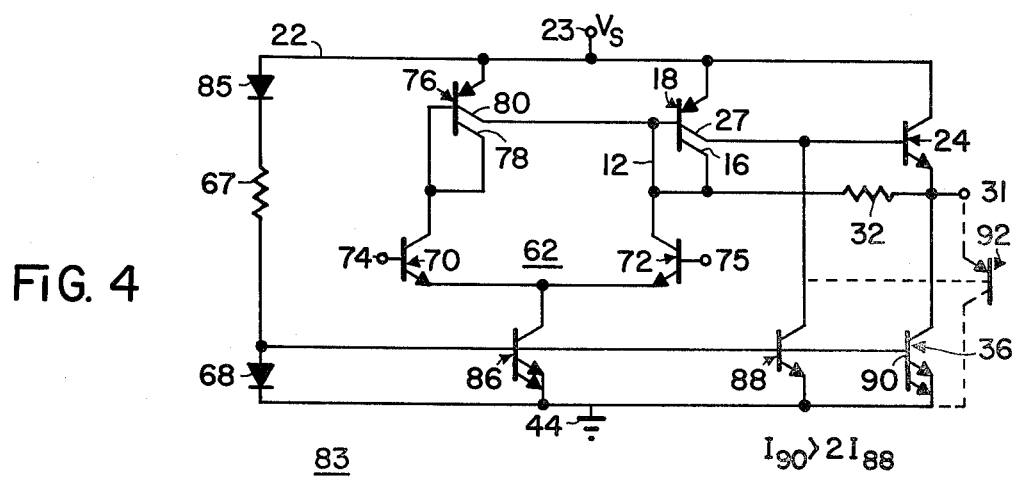

BUFFER AMPLIFIER CIRCUIT SUITABLE FOR MANUFACTURE IN MONOLITHIC INTEGRATED CIRCUIT FORM

BACKGROUND OF THE INVENTION

Buffer amplifier circuits are presently used in electronic equipment for isolating a driver circuit having a relatively high output impedance from a load, increasing the power level of a driving signal and establishing a desired quiescent direct current (DC) output potential. More specifically, integrated circuits often include buffer amplifier circuits which are electrically connected between the output terminals of differential amplifiers having differential-to-single ended converters and the loads for these amplifiers. Buffer amplifier circuits are sometimes required to provide a quiescent potential at the output terminal thereof which is substantially midway between power supply potentials to facilitate maximum excursion of a sinusoidal output signal, for instance. Such amplifiers are also required to maintain the balance of the driver differential amplifiers to prevent the creation of undesirable offset voltages within the differential amplifiers.

Some prior art buffer circuits rely on reference voltages for establishing the quiescent output voltage thereof. Unfortunately, such reference voltages often have a tendency to change in magnitude with temperature change or with power supplly magnitude variation. The resulting shift in quiescent potential can cause clipping of either the positive or negative extremes of the output signal thereby causing undesired distortion. Moreover, prior art circuits sometimes require a plurality of components that take up a large amount of area of an integrated circuit, which results in increased cost and decreased reliability as compared to circuits taking up less area. Moreover, some prior art circuits create an undesirable amount of voltage drop thereby decreasing the maximum possible amplitude of the output signal thereof. Furthermore, prior art circuits are sometimes difficult to test when provided in monolithic integrated circuit form because of the difficulty of predicting the dynamic and quiescent signal magnitudes therein.

SUMMARY OF THE INVENTION

One object of the invention is to provide a buffer amplifier circuit for isolating a driver circuit from a load.

Another object of the invention is to provide a buffer amplifier circuit suitable for establishing a predictable, stable quiescent output voltage and for providing an output signal having a maximum amplitude.

A further object of the invention is to provide a buffer amplifier circuit which is suitable for use with a differential amplifier having a differential-to-single ended converter and which allows the differential amplifier to remain balanced.

A still further object of the invention is to provide a buffer amplifier configuration which is suitable for manufacture in integrated circuit form, which is relatively simple as compared to prior art monolithic buffer amplifiers, and which takes up less chip area than some other monolithic buffer amplifiers.

Briefly, an amplifier circuit of one embodiment of the invention includes a multi-element input device such as either a multi-collector input transistor or a composite device including parallel connected transistors of a first conductivity type and an output transistor of a second conductivity type. The base electrode of the output transistor is connected to a first of the collectors of the input device, for instance. A bias circuit is also connected to the first collector electrode of the multi-collector device and to the base electrode of the output transistor. A negative feedback circuit is connected between the emitter electrode of the output transistor and the base electrode and a second collector electrode of the input device for stabilizing the quiescent output voltage. The bias circuit and the negative feedback circuit enables the quiescent output voltage to have a predictable value. Also, a temperature independent or temperature compensating current source circuit can be used in the bias circuit for the output transistor to minimize variations in the amplifier quiescent output voltage with temperature change. Moreover, a current sink circuit can be connected to the emitter electrode of the output transistor to enable the dynamic output voltage of the amplifier circuit to have maximized amplitude.

BRIEF DESCRIPTION OF THE DRAWINGS

FIG. 1 is a schematic diagram of a buffer amplifier of one embodiment of the invention;

FIG. 2 is a waveform illustrating the amplitude of an output signal for the buffer amplifier of FIG. 1;

FIG. 3 is another schematic diagram showing a differential amplifier having the buffer amplifier of FIG. 1; and FIG. 4 is still another schematic diagram of a differential amplifier having a buffer amplifier of another embodiment of the invention including temperature compensating current sources.

DETAILED DESCRIPTION OF THE PREFERRED EMBODIMENTS

Buffer amplifier circuit 10 of one embodiment of the invention is illustrated in FIG. 1. Input terminal 12 is adapted to receive a single-ended input signal whose power level is increased by amplifier circuit 10. Also input terminal 12 is connected to base electrode 14 and to collector electrode 16 of multi-collector PNP lateral transistor 18. Emitter electrode 20 of input transistor 18 is connected to power supply conductor 22 which is adapted to receive a positive supply potential from terminal 23. Transistor 18 is a current mirror wherein the output current of collector 27 has substantially the same magnitude as the input current at base electrode 14 and collector electrode 16.

NPN output or buffer transistor 24 includes a base electrode 26 which is connected to the other collector electrode 27 of transistor 18, a collector electrode 30 which is connected to conductor 22 and an emitter electrode 28 which is connected to output terminal 31. NPN transistor 24 is connected in an emitter follower configuration for enabling circuit 10 to have a low output impedance so that a driver circuit having relatively higher output impedance connected to terminal 12 is isolated from an electrical load connected to terminal 31.

Negative feedback resistor 32 has one end connected to both base 14 and collector 16 of transistor 18, and another end connected to output terminal 31. Terminal 34 of constant current control circuit 36 is connected to one end of resistor 32 and to emitter 28 of transistor 24. Constant current circuit 36 is a current source or sink of any one of a plurality of known configurations and hence is shown in generalized form. Bias resistor 38 is connected between collector electrode 27 of transistor 18 and the anode electrode of bias diode 40. The cathode electrode of diode 40 and terminal 42 of current circuit 36 are connected to conductor 44 which is adapted to provide a negative or ground power supply potential. Although the circuits of this application are depicted in a form suitable for inclusion in monolithic integrated structures, the circuits could be adapted to discrete form by using parallel connected transistors in place of multi-element transistors, in a manner known to those skilled in the art.

QUIESCENT OPERATION

Circuit 10 is self biasing. The geometry of transistor 18 is such that each collector thereof provides an equal current (I) under quiescent conditions. To simplify the explanation, it is assumed that the base currents and the saturation voltages of transistors 18 and 24 are negligible and that the base-to-emitter voltages of transistors 18 and 24 and the voltage drop across diode 40 are all equal ($\phi$). Also, the values of the resistances (R) of resistors 32 and 38 are assumed to be equal. The quiescent magnitude of the voltage from terminal 31 to terminal 23 is equal to the voltage across resistor 32 plus the base-to-emitter voltage ($\phi$) of transistor 18. The quiescent voltage between terminal 31 and conductor 44 is equal to the voltage across resistor 38 minus the base-to-emitter voltage of transistor 24 ($\phi$) plus the voltage drop across diode 40 ($\phi$). Since the voltages across resistors 32 and 38 are equal (IR) and since the junction drops ($\phi$) are all equal, the quiescent voltage ($V_Q$) at terminal 31 is expressed in equation (1):

$$V_Q = \frac{V_S - \phi}{2} \quad (1)$$

where ($V_S$) is the supply voltage between conductors 22 and 44. The quiescent voltage ($V_Q$) is designated by point 50 on amplitude axis 52 of the graph of FIG. 2.

Resistor 32 operates to provide negative feedback for stabilizing the above quiescent output voltage. More specifically, if transistor 24 tends to undesirably conduct more current because of changes in supply voltage or temperature, the voltage of emitter 28 thereof will tend to increase thereby decreasing the base current of transistor 14 through resistor 32. This tends to render transistor 18 slightly less conductive thereby decreasing the current at collector 27 thereof. Consequently, the bias voltage across diode 40 and resistor 38 decreases to render transistor 24 less conductive and thereby stabilize the voltage at terminal 31 to the desired quiescent operating level. Constant current circuit 36 is designed to sink at least twice the quiescent current supplied through resistor 32.

FIG. 3 is a schematic diagram of a composite circuit 60 including differential amplifier 62 having buffer amplifier circuit 10 coupled thereto. The same reference numbers are used in FIG. 1 and FIG. 3 to designate corresponding components. Differential amplifier 62 includes a NPN constant current control circuit transistor 64 having an emitter electrode connected to negative power supply conductor 44. The base electrode of current circuit transistor 64 is connected through resistor 66 to positive power supply conductor 22 and through diode 68 to negative power supply conductor 44. The resistance of resistor 66 controls the magnitude of the current through biasing diode 68 and hence, the magnitude of the collector current of transistor 64.

NPN differential transistors 70 and 72 have their respective emitter electrodes connected together and to the collector electrode of constant current circuit transistor 64. Base electrodes 74 and 75 of respective transistors 70 and 72 are coupled to the differential input terminals of composite circuit 60. The collector electrode of transistor 70 is connected to multi-collector, differential-to-single ended converter transistor 76 which is a current mirror having an output current of a magnitude substantially equal to the magnitude of the input current. Current mirrors 18 and 76 have identical structures which enables differential amplifier 62 to remain balanced. Collector 78 of PNP transistor 76 is connected to the base electrode thereof and the emitter of transistor 76 is connected to positive supply conductor 22. Collector 80 of PNP lateral transistor 76 is connected to input terminal 12 of buffer circuit 10 and to the collector electrode of differential transistor 72.

It is assumed that current control transistor 64 is biased by resistor 66 and diode 68 to constantly conduct a current having a magnitude of 2I. Under quiescent conditions transistors 70 and 72 are each biased to conduct a current of a magnitude I. Consequently transistor 76 tends to provide a current having a magnitude of I into resistor 32 and transistor 72 tends to draw a current having a magnitude of I which is supplied by collector 16 of transistor 18. Thus under quiescent conditions, transistor 72 tends to draw from node or terminal 12 a current having a magnitude equal to that supplied by collector 80 of transistor 76. Hence, differential amplifier circuit 62 supplies no net current to the buffer circuit 10 during quiescent operation but allows buffer circuit 10 to operate in the previously described manner.

DYNAMIC OPERATION

A differential input signal is assumed which renders transistor 70 less conductive and transistor 72 more conductive, to facilitate explanation of the dynamic operation of circuit 60. Consequently, transistor 76 is rendered less conductive in response to the base voltage thereof becoming more positive because of the increase in the collector voltage of transistor 70. Consequently, collector 80 of transistor 76 provides less current into node 12 thereby tending to render transistor 18 more conductive. Moreover, the reduced collector voltage of transistor 72 provides a more negative potential at the base electrode of transistor 18 which tends to also render transistor 18 more conductive to provide increased currents through collectors 16 and 27. Transistor 72 absorbs the increased current of collector 16 of transistor 18.

The increased current from collector 27 of transistor 18 tends to increase the voltage across resistor 38, and transistor 24 causes the voltage on terminal 31 to also increase. Thus the current through resistor 32 is reduced. At node 12 the currents in collector 16 of transistor 18 and in the collector transistor 72 increase while the currents in collector 80 of transistor 76 and in resistor 32 decrease. Consequently, the amplitude of the output voltage at output terminal 31 tends to increase as illustrated by positive waveform portion 81 between times T0 and T1 of time axis 82 of FIG. 2.

The maximum positive excursion of waveform portion 81 is designated by point 84 which is only $1\phi$ below the positive power supply potential ($V_S$). When this point is reached transistor 72 is conducting substantially all of the current of current control device 64 and transistor 70 is conducting substantialy no current. Under these conditions, transistor 72 conducts a current having a magnitude of 2I provided by collector 16 of transistor 18. Consequently, virtually no curent passes through resistor 32. Also, the current through resistor 38 has a magnitude of about 2I thereby creating a voltage for driving transistor 24 to a condition of complete conduction. The magnitude of the drive current for transistor 24 is limited by the resistance of resistor 66 such that transistor 24 does not go into saturation and clip waveform portion 81 at time T1. Thus, the amplitude of portion 81 is maximized but no distorted.

Between times T2 and T4, transistor 70 is rendered conductive and transistor 72 is rendered relatively nonconductive by the input signal across electrodes 74 and 75. As a result, transistor 76 provides increased current through collector 80 is response to the decreased collector potential of transistor 70. The increased current into the base of transistor 18 tends to render it nonconductive. Moreover, the increase in the collector potential of transistor 72 also tends to decrease the amount of current provided by transistor 18 through collectors 16 and 27 thereof. Consequently, the current provided through resistor 32 tends to increase but due to the net decrease resulting from output transistor 24 being rendered nonconductive, the output voltage at output terminal 31 falls until it reaches the negative extreme or ground potential as designated at point 86 on negative waveform portion 87. At this time output transistor 24 is conducting substantially no current to the load and resistor 32 is conducting a current having a magnitude of approximately 2I. The current from resistor 32 is absorbed by current control circuit 36 and accordingly does not result in an increase in the voltage across the load. Since circuit 60 can be designed so that transistor 24 is rendered nonconductive at point 86, portion 87 of waveform 81 is not clipped even though the negative magnitude of portion 87 is maximized. Thus, circuit 60 of one embodiment of the invention makes maximum use of the supply potentials supplied across conductors 22 and 44 by allowing maximum excursion of output waveform portions 81 and 87 without causing clipping distortion thereof. This characteristic of circuit 60 is particularly desirable in application involving audio frequency signals, for instance, where high fidelity is important.

Circuit 60 of FIG. 3 provides a quiescent output voltage at output terminal 31 thereof having a small temperature coefficient which results from the fact that diode 40 compensates for or cancels the temperature coefficient (TC) of only one of the junctions of devices 18 and 24. Circuit 60 could be modified to have an essentially zero temperature coefficient by including an additional diode in the series circuit between the base electrode of transistor 24 and diode 40.

ALTERNATIVE EMBODIMENT

FIG. 4 discloses an additional embodiment 83 of the invention which in many respects has similar structure and operation to circuit 60 of FIG. 3. Thus, the same reference numbers are used in FIG. 4 as are used in FIG. 3 to designate corresponding components. Circuit 83 solves the temperature problem in a manner preferable to that previously described with respect to FIG. 3.

In circuit 83, the series circuit including diode 68, 85 and resistor 67 establishes the bias voltage for dual emitter current control or source transistor 86. The bias for single emitter current source transistor 88 and dual emitter current source transistor 90 is also provided by the series circuit including diodes 68, 85 and resistor 67. Alternatively, transistors 88 and 90 could be biased from separate bias supplies. Inasmuch as transistors 86 and 90 have dual emitters connected to negative power supply conductor 44 and transistor 88 has only a single emitter connected to power supply 44, transistors 86 and 90 conduct twice as much current (2I) as transistor 88 (I). Under quiescent conditions, transistors 70 and 72 each conduct a current having a magnitude of I. Consequently, collector 80 of turn-around device 76 provides a current I through resistor 32 and transistor 72 draws a current I from node 12 which is supplied by collector 16 of device 18. Dual emitter transistor 90 conducts a constant current having a magnitude which is greater than or equal to 2I. Current circuit transistor 88 conduts a substantially constant current I from collector 27 of transistor 18 and collector 16 provides a substantially constant current I. If the resistance of resistor 67 is twice the resistance (2R) of resistor 32 (R) then the magnitude of the current I is equal to the voltage between supply conductors 22 and 44 ($V_S$) minus the junction drops ($\phi$) of diodes 85 and 68 divided by the resistance of resistor 67 (2R), as follows:

$$I = \frac{V_S - 2\phi}{2R} \qquad (2)$$

Since the current conducted by current source devices, 86, 88 ad 90 are controlled by the magnitude of the current through resistor 67, the current through the current sources or current control circuits including devices 86, 88 and 90 are largely independent of the temperature induced changes in base-to-emitter or junction voltages of the devices of circuit 83. Thus the quiescent voltage magnitude at output terminal 31 remains stable with temperature change.

Resistor 32 again provides negative feedback for stabilizing the quiescent output voltage. In particular if the voltage at the emitter of transistor 24 tends to undesirably decrease, for instance, during quiescent conditions, current will be drawn from the base electrode of transistor 18 through resistor 32 which will cause the currents of collectors 16 and 27 of transistor 18 to slightly increase to thereby increase the quiescent voltage at the emitter of output transistor 24. Thus, resistor 32 provides negative feedback for stabilizing the quiescent voltage at output terminal 31 in a manner similar to the operation of circuit 10.

The dynamic operation of circuit 83 will now be considered. It is assumed that a differential input signal is applied between electrodes 74 and 75 which renders transistor 70 relatively nonconductive and transistor 72 relatively conductive. Accordingly, device 76 is rendered relatively nonconductive and thus tends to turn on transistor 18. In addition, transistor 72 draws more current from the base of transistor 18 which also tends to turn transistor 18 on. Thus transistor 18 is rendered slightly more conductive by the above described actions of transistors 72 and 76 and thereby causes transistor 24 to be conductive and to supply more current to the load connected to terminal 31. The resulting change in the current fed back through resistor 32 makes up for the change in current in transistors 72 and 76 to keep the currents of transistor 18 substantially constant. Negative feedback through resistor 32 tends to minimize the signal changes within transistor 18 during dynamic operation of circuit 83.

Current source 36 could be eliminated from circuit 83 if the load connected to terminal 31 consisted of a DC impedance to ground. However, under these conditions the lowest possible output voltage magnitude would be determined by a voltage divider including resistor 32 and the output load impedance. Current source 36 enables the output voltage of amplifier 83 to swing all the way to ground plus the saturation voltage of current source transistor 90 thereby enabling amplifier 83 to have a maximized negative output voltage magnitude. An additional PNP transistor 92 having an emitter electrode connected to terminal 31, a base electrode connected to the collector of transistor 88 and a collector electrode connected to conductor 44, can be added if desired to increase the ability to sink current from a load connected to terminal 31.

What has been described, therefore, is a buffer amplifier circuit 10 for isolating a driving circuit 62 from a load connected to output terminal 31. Buffer amplifier circuit 10 establishes a predictable, stable quiescent output voltage at output terminal 31. Resistor 32 provides negative feedback between output terminal 31 and base 14 of transistor 18 which tends to stabilize the quiescent output voltage level at terminal 31. Also, the configuration of circuit 10 enables the quiescent output voltage to be easily predicted since it depends on the values of known resistors and junction voltage drops. Circuit 10 provides a minimum of voltage drops in series between the load and supply conductors 22 and 44 thereby maximizing the amplitude of the output signal. As illustrated in FIGS. 3 and 4, buffer circuit 10 is suitable for use with composite circuits having a differential amplifier 62 and a differential-to-single ended converter 76. The imperfections of transistor 18 balance out the imperfections of transistor 76. As previously explained, circuit 10 draws no net current from the composite driving circuit and thereby allows differential amplifier 62 to remain balanced. Buffer amplifier circuit 10 is suitable for manufacture in integrated circuit form and is relatively simple as compared to other prior art monolithic buffer amplifiers. Furthermore, circuit 10 takes up less chip area than some other monolithic buffer amplifiers.

I claim:

1. An amplifier circuit having an output terminal and including in combination:

first electron control means for providing an output current having a magnitude which is a known function of the input current, said first electron control means having a power input electrode, a control electrode and a plurality of power output electrodes, said control electrode being adapted to receive the signal to be amplified;

second electron control means for isolating said first electron control means from an electrical load, said second electron control means having a power input electrode, a control electrode and a power output electrode, said control electrode of said second electron control means being connected to one of said plurality of output electrodes of said first electron control means, and said output electrode of said second electron control means being coupled to the output terminal of the amplifier circuit;

negative feedback means coupling said output electrode of said second electron control means to said control electrode and to another of said output electrodes of said first electron control means for stabilizing the magnitude of the quiescent output voltage at the output terminal of the amplifier circuit; and bias means for said second electron control means connected to said one of said output electrodes of said first electron control means and to said control electrode of said second electron control means for establishing a bias potential of a predictable magnitude at the output terminal of the amplifier circuit.

2. The amplifier circuit of claim 1 wherein said bias means includes a resistive means.

3. The amplifier circuit of claim 1 wherein said bias means includes current control means.

4. The amplifier circuit of claim 1 wherein said negative feedback includes resistive means.

5. The amplifier circuit of claim 1 further including current control means connected to said output electrode of said second electron control means for facilitating maximum excursion of the amplifier output signal.

6. The amplifier circuit of claim 1 wherein said first electron control means includes a multi-collector current mirror transistor having first and second collector electrodes, an emitter electrode and a base electrode, said first collector electrode being connected to said control electrode of said second electron control means, and said second collector electrode being connected to said base electrode of said multi-collector transistor and to said negative feedback means.

7. The amplifier circuit of claim 6 wherein said second electron control means includes an emitter follower transistor of a conductivity type different from the conductivity type of said multi-collector current mirror transistor, said emitter follower transistor having emitter, base and collector electrodes respectively corresponding to said output, control and input electrodes of said second electron control means.

8. The amplifier circuit of claim 1 wherein said input electrodes of said first and second electron control means are adapted to receive electrical power.

9. An amplifier circuit suitable for being provided in integrated circuit form, including in combination:

a pair of differentially connected electron control means each having an input electrode, a control electrode and an output electrode, said input electrodes being electrically connected to each other;

first current control means coupled to said input electrodes of said pair of differentially connected electron control means;

differential-to-single ended converter means coupled to one of said differentially connected electron control means; and buffer circuit means having an input electron control means with input, control and a plurality of output electrodes, said control electrode of said input electron control means being coupled to said differential-to-single ended converter means and to said other differentially connected electron control means, output electron control means having control, input and output electrodes, said control electrode of said output electron control means being connected to one of said output electrodes of said input electron control means, said output electrode of said output electron control means being coupled to an output terminal of the amplifier circuit, and negative feedback means coupling said output electrode of said output electron control means to said control electrode of said input electron control means for stabilizing the magnitude of the quiescent output voltage at the output terminal of the amplifier circuit.

10. The amplifier circuit of claim 9 further including bias means for said output electron control means connected to said one of said output electrodes of said input electron control means.

11. The amplifier circuit of claim 9 wherein said bias means includes a series circuit including resistive means and diode means.

12. The amplifier circuit of claim 9 wherein said bias means includes second current control means for stabilizing the output signals of the amplifier circuit with temperature.

13. The amplifier circuit of claim 9 further including additional current control means coupled to said output terminal of the amplifier circuit for maximizing the amplitude of dynamic output signals thereof.

14. The amplifier circuit of claim 9 wherein:
said differential-to-single ended converter includes a first current mirror; and
said input electron control means includes a second current mirror which has substantially the same configuration as said first current mirror.

15. The amplifier circuit of claim 9 wherein said negative feedback means is also coupled to another of said output electrodes of said input electron control means.

16. The amplifier circuit of claim 15 wherein
said input electron control means includes a multicollector transistor of one conductivity type having emitter, base, and a plurality of collector electrodes corresponding respectively to said input, control and output electrodes of said input electron control means; and
said output electron control means includes a transistor of another conductivity type having emitter, base and collector electrodes corresponding respectively to said output, control and input electrodes of said output electron control means.

* * * * *